United States Patent [19]

Sachs et al.

[11] 3,990,047
[45] Nov. 2, 1976

[54] BURST TRANSMISSION CONTROL SYSTEM

[75] Inventors: Jean-Pierre Sachs, Paris; Jean-Claude Six, Sevres, both of France

[73] Assignee: U.S. Philips Corporation, New York, N.Y.

[22] Filed: Apr. 16, 1975

[21] Appl. No.: 568,707

[52] U.S. Cl. .................... 340/167 R; 340/167 A
[51] Int. Cl.² .................................. H04Q 9/14
[58] Field of Search ...... 340/167 R, 167 A, 147 PC, 340/164 A, 164 R; 343/225; 178/DIG. 15

[56] References Cited
UNITED STATES PATENTS 3,546,674 12/1970 Cannalte ...................... 340/167 R
3,657,703 4/1972 Steinlein ...................... 340/167 R
3,774,217 11/1973 Bonner .............................. 343/225

*Primary Examiner*—Harold I. Pitts
*Attorney, Agent, or Firm*—Frank R. Trifari; Daniel R. McGlynn

[57] ABSTRACT

A burst transmission remote control system in which the information about the functions of N transmission channels are indicated by (N + 1) intervals between (N + 2) narrow pulses which are transmitted in repeated bursts, the duration of the intervals having two values defined by the presence or absence of information. The system includes a transmitter having cascaded trigger circuits, and a receiver having a binary/decimal decoder circuit.

10 Claims, 38 Drawing Figures

BURST TRANSMISSION CONTROL SYSTEM

BACKGROUND OF THE INVENTION

The present invention relates to a method of remotely controlling a plurality of bidirectionally variable functions by means of repeatedly transmitted bursts of pulse signals.

The invention also relates to a transmit-receive device for us in the said method, which device includes at the transmitter end a keyboard and a clock signal generator and at the receiver end a binary counter which cooperates with a binary/decimal decoder circuit.

The invention relates in particular but not exclusively to devices which enable a user to remotely and wirelessly control various settings of apparatuses such, for example, as television receivers or hi-fi installations by means of a small-size operating case.

Devices of this type are known for remotely controlling, for example, the sound volume, the contrast and the brightness of a television receiver. If further functions such, for example, as channel selection, color saturation, switch-on and switch-off etc. are also to be influenced, the large number of items of information to be transmitted requires complicated modulation of a current or an acoustic, optical or radio-frequency carrier. The receiver also will then become complex, because a large number of resonant filters must be used which must be tuned to modulation frequencies corresponding to the various functions.

For example, remote control of the afore-mentioned six functions requires twelve items of information to be transmitted, because each function must be variable in two directions.

Moreover, permanent modulation of the carrier when transmitting a remote control instruction requires an appreciable expenditure of energy so that the control case must be provided with a battery of a capacity sufficient for use during a reasonable time.

SUMMARY OF THE INVENTION

It is an object of the present invention to provide a remote control device using a simple method of modulation which enables the instructions to be transmitted with high reliability and low energy consumption.

Another object of the invention is to obtain the above result by means of circuits which can readily be manufactured in the form of hybrid or monolithic insulated circuits both at the transmitter end and at the receiver end.

According to the invention a method of remotely controlling a plurality of bidirectionally variable functions by means of repeatedly transmitted bursts of pulse signals is characterized in that for N functions or transmission channels each burst comprises (N + 2) pulses of substantially equal amplitude separated by (N + 1) intervals which may have a duration $t_1$ or $t_2$, the first interval of each burst, which alternately has a duration $t_1$ and $t_2$, being associated with the information of the direction in which the or each function to be remotely controlled is to be changed, while the following N intervals associated with each of the functions may have either the value $t_1$ or the value $t_2$ according to the absence or presence of remote control instructions.

Advantageously the value of $t_2$ is substantially twice that of $t_1$.

According to the invention the transmit-receive device for use in the said method which at the receiver end includes inter alia a keyboard and a clock signal generator and at the receiver end includes a binary counter which cooperates with a binary/decimal decoder circuit, is characterized at the receiver end by the provision of (N + 1) monostable trigger circuits which are connected in cascade to the clock signal generator, each of these (N + 1) trigger circuits having a terminal for controlling the duration of the unstable state, which terminal for N of the trigger circuits is connected by two keys of the keyboard to two complementary output conductors of a bistable trigger circuit which also is connected to the clock signal generator, while for the $(N + 1)^{th}$ monostable trigger circuit this terminal is directly connected to one of the said two conductors, the clock pulse generator and the outputs of the (N + 1) monostable trigger circuits being connected to (N + 2) differentiating circuits the interconnected outputs of which are coupled to the input of a shaper circuit, and in that at the receiver end the output of a shaper circuit for received signals is connected to the input terminal of a binary counter and also to the input of a resettable bistable trigger circuit the output of which is connected to a terminal for inhibiting the operation of the binary/decimal decoder circuit one of the decimal outputs of which is fed back via a monostable trigger circuit to that binary input which has a width next higher than that of those which cooperate with the binary counter.

Advantageously another resettable trigger circuit is connected between the input terminal and the reset-to-zero terminal of the binary counter.

When a key of the keyboard is depressed, the corresponding information is transmitted in the form of a "long" interval in every other burst according to the desired direction of change. At the receiver end this information, which appears in the form of a pulse at one of the decimal outputs of the decoder circuit, is integrated to provide a control voltage which persists as long as the key is depressed.

Because the number of functions to be remotely controlled influences the duration only of the bursts, it will readily be understood that this number can be high without adversely affecting the accuracy of the device according to the invention.

BRIEF DESCRIPTION OF THE DRAWINGS

An embodiment of the invention will now be described, by way of example, with reference to the accompanying diagrammatic drawings, in which.

DESCRIPTION OF THE PREFERRED EMBODIMENTS

Figure 1:
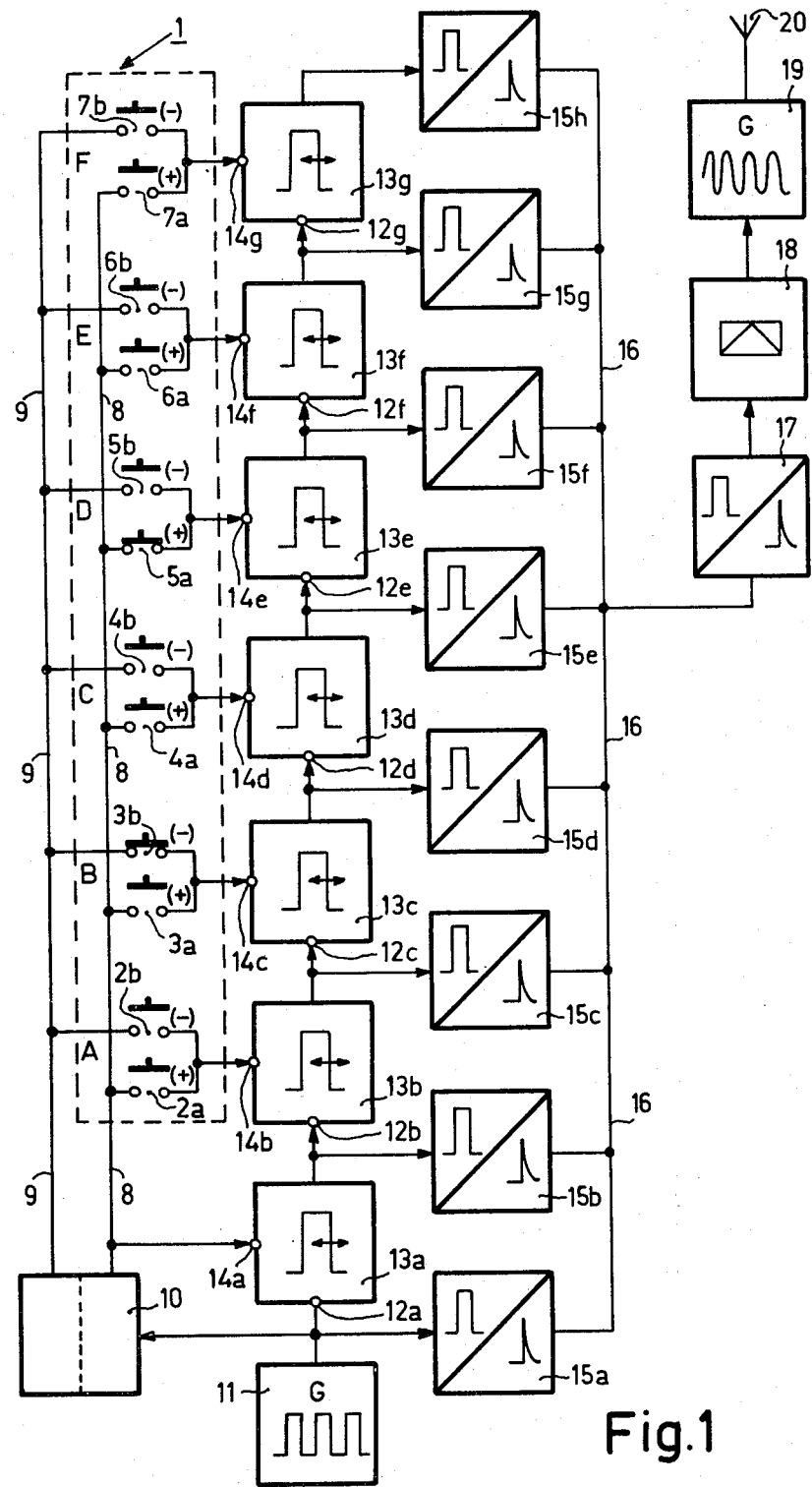
FIG. 1 is a block diagram of the transmitter part of the device according to the invention for radio-frequency remote control.

Referring now to FIG. 1, a control case 1 comprises six positive-control keys 2a, 3a, 4a, 5a, 6a and 7a and six negative-control keys 2b, 3b, 4b, 5b, 6b and 7b for six function transmission channels A, B, C, D, E and F respectively. The terms "positive control and negative control" are used to mean control operations which cause a function to be increased and decreased respectively.

The separate contacts of the keys 2a to 7a and 2b to 7b are connected to two output leads 8 and 9 respectively of a bistable trigger circuit 10 the trigger input of which is connected to a clock signal generator 11.

The output of the generator 11 is also connected to a trigger terminal 12a of a first monostable trigger circuit 13a which also is provided with an input terminal 14a through which the duration of the instable state is controlled and which is connected to the lead 8.

The output of the monostable trigger circuit 13a is connected to an input terminal 12b of a second monostable trigger circuit 13b which is followed by five further similar trigger circuits 13c, 13d, 13e, 13f and 13g which are also connected in cascade.

The contacts which are common to the keys 2a–2b, 3a–3b, 4a–4b, 5a–5b, 6a–6b and 7a–7b are connected to the input terminals 14b to 14g for controlling the duration of the instable state of the trigger circuits 13b to 13g respectively.

The output of the clock pulse generator 11 and each of the outputs of the trigger circuits 13a to 13g are connected to the inputs of eight differentiating circuits 15a to 15h respectively the outputs of which are connected to a common lead 16.

The input of a shaper circuit 17 is connected to the lead 16 and its output is connected to the input of a modulator circuit 18 which is coupled to a radio-frequency generator 19 connected to an antenna 20.

Figure 2:
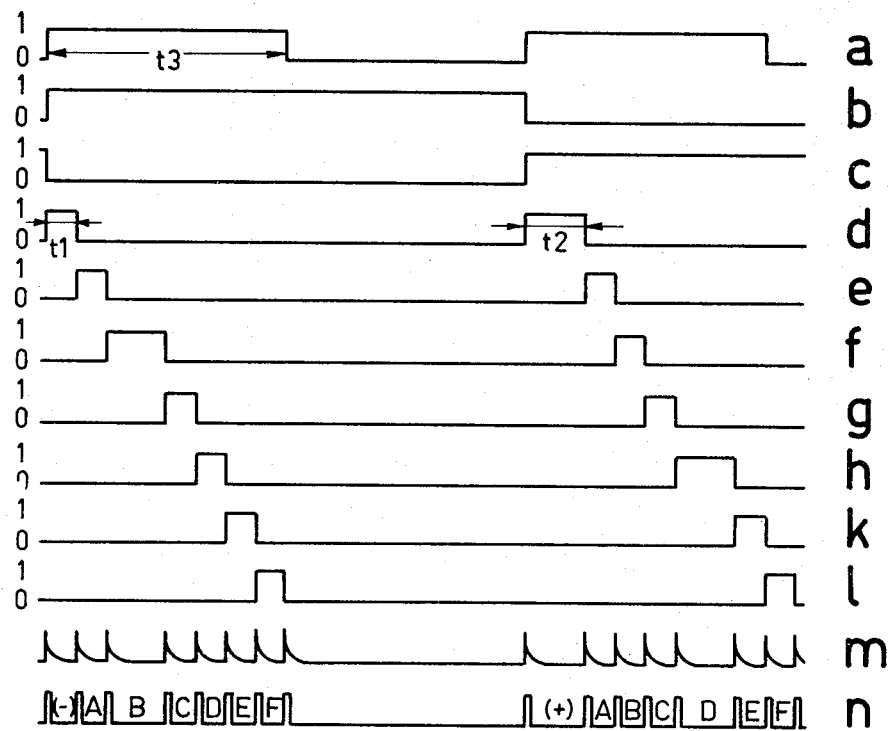
FIGS. 2a to 2n are waveforms of signals at various points of the diagram of FIG. 1.

The transmitter of FIG. 1 operates as follows:

The monostable trigger circuits 13a to 13g are arranged to supply rectangular pulses of duration $t_1$ when the terminals 14b to 14g are in the state "0" or "indeterminate", and of substantially double duration $t_2$ when the said terminals are in the state "1" (FIG. 2d).

The clock signals of duration $t_3$ (FIG. 2a) by their leading edges trigger the bistable trigger circuit 10 which supplies a state 0 to the lead 8 (FIG. 2b) and a state 1 to the lead 9 (FIG. 2c); at the same time the leading edge of the clock signal triggers the trigger circuit 13a the terminal 14a of which is in the state 0 and which consequently supplies a rectangular pulse of duration $t_1$ (FIG. 2d) the trailing edge of which triggers the trigger circuit 13b which also supplies a rectangular pulse of duration $t_1$, because the terminal 14b is "indeterminate" (FIG. 2e).

On the other hand, the rectangular pulse supplied by the trigger circuit 13c has the duration $t_2$ (FIG. 2f), because the terminal 14c is set to the state 1 by depressing the key b connected to the lead 9; the four remaining trigger circuits 13d to 13g are successively triggered in the same manner and all supply rectangular pulses of duration $t_1$ (FIGS. 2g, 2h, 2k and 2l), including the trigger 13e the terminal 14e of which is set to the state 0 by depression of the key 5a.

The leading edges of the clock signal and of the rectangular output pulses of the trigger circuits 13a to 13g are processed by the differentiating circuits 15a to 15h with the result that on the common output lead 16 a first burst of pulses appears (FIG. 2m); these pulses then are shaped by the circuit 17 which comprises a monostable trigger circuit which supplies a burst of eight narrow rectangular pulses (FIG. 2n) which define seven intervals the first of which carries the information of the direction of change (in this case conventionally (−)) while the other six are associated with to the function channels A, B, C, D, E and F.

With respect to these waveforms it will be seen that the interval which corresponds to the channel B and is longer than those which correspond to the other channels carries control information due to depression of the key 3b of the keyboard 1 which is associated with the channel (−) B.

At the second leading edge of the clock signal the bistable trigger circuit 10 changes state so that the lead 8 is set to the state 1 (FIG. 2c) and the lead 9 is set to the state 0 (FIG. 2b). Under these conditions the terminal 14a of the trigger circuit 13a is set to the state 1 and hence this trigger circuit supplies a rectangular pulse of duration $t_2$ (FIG. 2d) which, after being processed in the differentiating circuits 15a and 15b and the shaper circuit 17, appears in the second burst in the form of a first "long" interval (FIG. 2n) which corresponds to the information about the direction of change, in this case (+). In these waveforms the long interval D corresponds to the depression of the key 5a which sets the terminal 14e of the trigger circuits 13e to the state 1.

Summarizing, when none of the keys of the keyboard 1 is depressed, the shaper circuit 17 supplies successive bursts the first interval of which alternately is "long" and "short" while all the remaining intervals are short.

Depressing any key increases the duration of the interval of the channel concerned in the burst the sign of which corresponds to that of the depressed key.

In so far there is no incompatibility between the functions to be controlled, it is possible to depress simultaneously several keys which correspond to different channels.

It is also possible, as will be explained hereinafter, to produce a supplementary operation by simultaneously depressing the (−) and (+) keys of one channel.

In the embodiments under consideration the periods $t_1$, $t_2$ and $t_3$ are of the order of 1, 2 and 10 milliseconds respectively, while the duration of the pulses which separate the intervals in FIG. 2n is substantially equal to 0.1 milliseconds. Under these conditions the successive bursts succeed one another at a rate of 2 × $t_3$, that is to say 20 milliseconds, while the theoretically maximum duration of a (+) burst when all the positive keys are depressed is 7 × 2 milliseconds = 14 milliseconds.

Obviously the transmitter of FIG. 1 includes, in a manner not shown, a power supply provided with a switch which may be separate or may be mechanically coupled to each of the keys of the keyboard.

Finally the signal bursts of FIG. 2n are applied to the circuit 18 in order to modulate the radio-frequency generator 19; however, the said signals may modulate, in a manner not shown, an optical or ultrasonic transmitter or even may be transmitted to the apparatus to be controlled via a cable.

Figure 3:
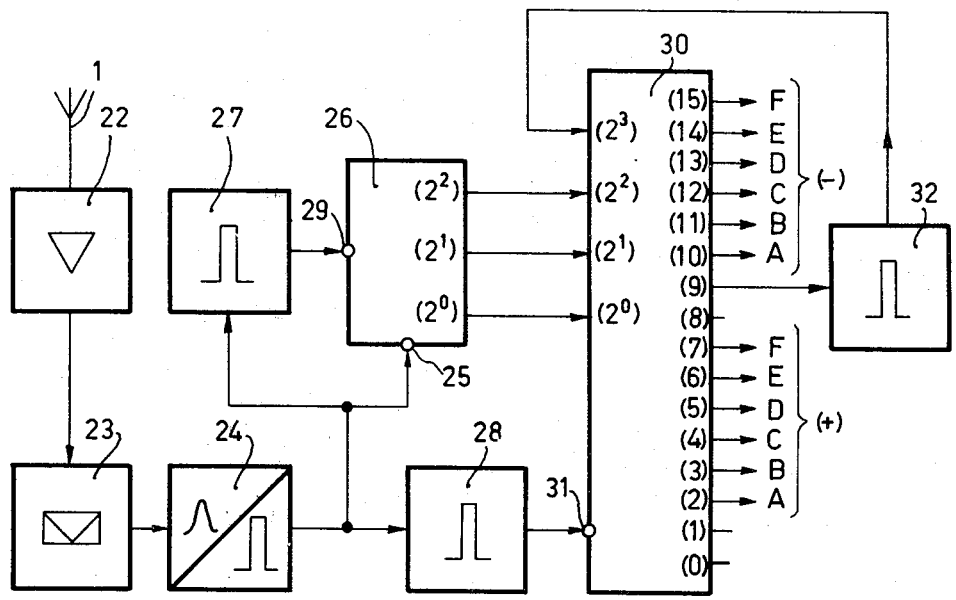
FIG. 3 is a block diagram of the demodulator and decoder section of the receiver part of the device according to the invention.

In FIG. 3 a receiving antenna 21 is coupled to a high-frequency amplifier 21 followed by a demodulator circuit 23, the output of which is connected to a shaping circuit 24.

The output of the shaping circuit 24 is connected to a trigger terminal 25 of a binary counter 26, to the input of a first resettable monostable trigger circuit 27 and to the input of a second resettable monostable trigger circuit 28. The output of the trigger circuit 27 is connected to a reset-to-zero terminal 29 of the binary counter 26 the counting outputs ($2^0$, $2^1$, $2^2$) of which are connected to the corresponding inputs of a binary/decimal decoder circuit 30 which is provided with an inhibit terminal 31 connected to the output of the trigger circuit 28.

The decimal output (9) of the decoder circuit 30 is connected to the input of a monostable trigger circuit 32 the output of which is coupled to the binary input ($2^3$) of this decoder circuit.

The receiver circuit of FIG. 3 operates in the following manner.

The high-frequency signal received by the antenna 21 is amplified, demodulated and then shaped by the circuit 24; the sucessive bursts are applied to the input 25 of the counter 26 (FIG. 4a); simultaneously the first pulse triggers the trigger circuit 27 (FIG. 4b) which enables the counter 26 to handle the said pulses.

An essential aspect of the decoding of the information consists in the duration of the unstable state of the resettable trigger circuit 28, which duration must be longer than $t_1$ and shorter than $t_2$ and hence in the embodiment under consideration of the order of 1.5 milliseconds.

Figure 5:
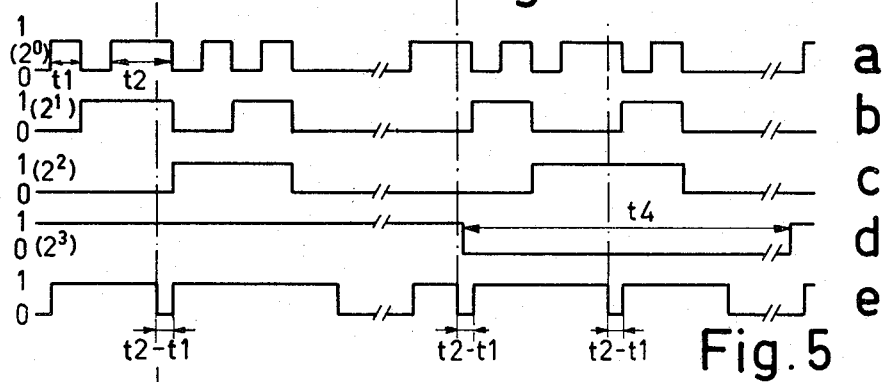
Figure 6:
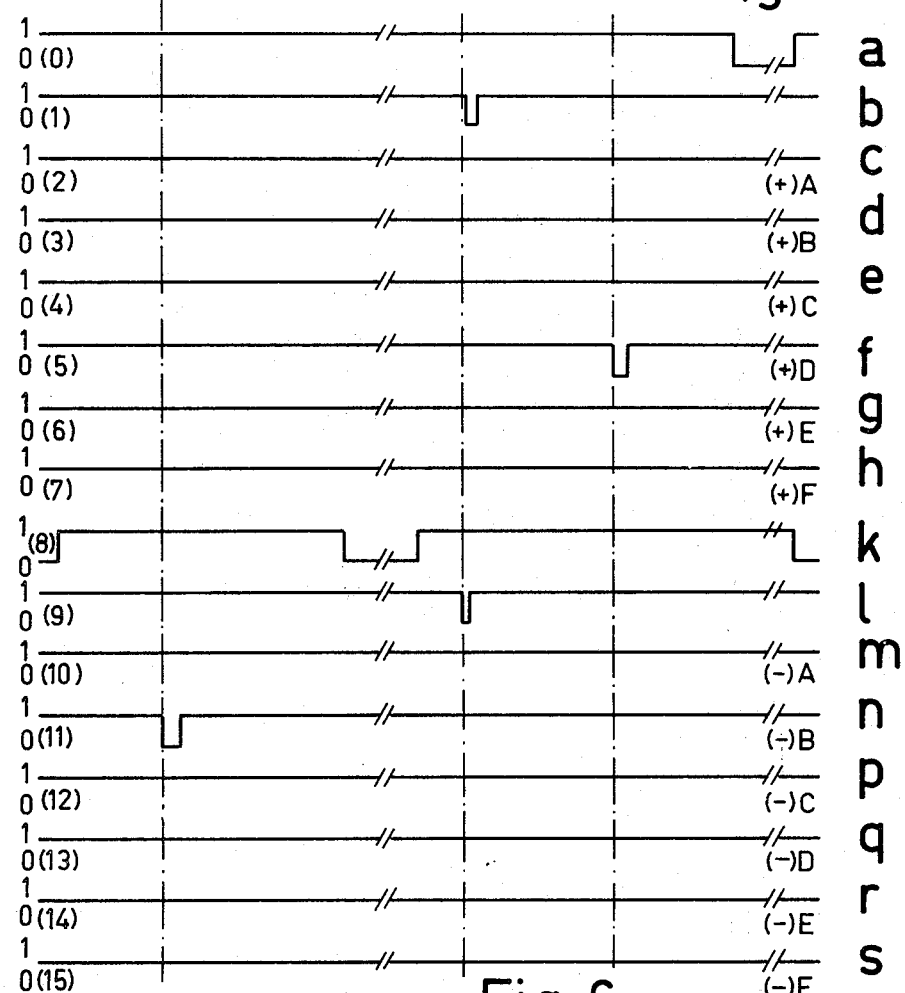

At the instant at which the first pulse appears the trigger circuit 28 is triggered (FIG. 5c), which inhibits the operation of the decoder circuit 30. During the first short interval (−) (FIG. 4a) of the first burst, all the decimal outputs of the decoder circuit 30 are in the state 1 (FIGS. 6a to 6s). This also applies to the following interval (−A), because the trigger circuit 28 has been reset and the appearance of the second pulse without having returned to 0.

On the other hand, during the third long interval (−B) the trigger circuit 28 can return to 0 during a period of time equal to $t_2 − t_1$ (FIG. 5c), in this case 0.5 millisecond. Because at this instant the input "$2^3$" of the decoder circuit 30 is set to the level 1 in the inoperative condition of the trigger circuit 32, the binary weights at the inputs of the said decoder circuit then are $2^0 + 2^1 + 2^3 = 11$ (FIGS. 5a to 5d); hence a pulse of level (0) appears at the output (11) of the decoder circuit 30 (FIG. 6n).

Because the four last intervals are short (−C, −D, −E, −F), the decoder 30, which is again inhibited at the beginning of the fourth pulse, no longer supplies any information "O" at its decimal outputs.

Figure 4:
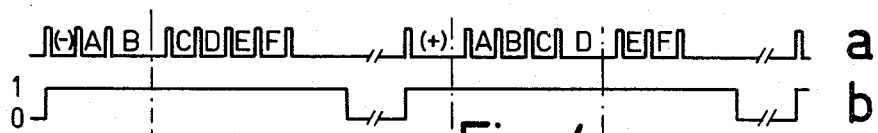
FIGS. 4a and 4b show waveforms of the signals applied to the binary counter of FIG. 3, FIGS. 5a to 5e show waveforms of the signals applied to the binary/decimal decoder circuit of FIG. 3, FIGS. 6a to 6s show waveforms of the output signals from the binary/decimal decoder arrangement of FIG. 3.

After the last pulse of the first burst the resettable trigger circuit 27, the duration of the unstable state of which is longer than $t_2$ and in this case is 3 milliseconds, detects the absence of pulses between two consecutive bursts and resets the counter 26 to zero (FIG. 4b).

At the second burst the first (+) interval is long (FIG. 4a), which enables the trigger circuit 28 to return to zero so as to energize the decoder circuit 30. As soon as the said trigger circuit returns to zero, the binary weights at the inputs of the decoder circuit 30 are $2^0 + 2^3 = 9$; then a pulse appears at the decimal output (9) (FIG. 61) which by triggering the trigger circuit 32 immediately sets the input $2^3$ of the decoder 30 to the level 0 (FIG. 5d). The binary weight at the input of the decoder then is $2^0 = 1$, and a rectangular pulse 0 appears at the decimal output (1), which immediately brings about the disappearance of the signal of the output (9), which thus is of extremely short duration.

The duration $t_4$ (FIG. 5d) of the unstable state of the trigger circuit 32 is chosen so as to be longer than the maximum duration of a positive burst, in this case 15 milliseconds. During this entire period the input ($2^3$) is at the level 0 and the energization of the decoder circuit 30 at the long interval (+D) (FIG. 4a) causes a rectangular pulse 0 to appear at the decimal output (5) (FIG. 6f), the binary weights at the input than being $2^0 + 2^2 = 5$ (FIGS. 5a to 5d).

After the period $t_4$ the trigger circuit 32 becomes inoperative again, which again sets the input $2^3$ of the decoder circuit to the level 1 for processing the following negative burst.

Summarizing, in the absence of a long interval at the beginning of a burst, the decoder circuit directs the information constituted by possible long intervals of the remainder of the burst towards the decimal outputs of large weights (10), (11), (12), (13), (14) and (15) thus associated to the negative instructions (−) of each of the channels A, B, C, D, E and F.

On the other hand, the presence of a long interval at the beginning of a burst immediately so conditions the decoder circuit that it directs possible information from the remainder of the burst towards the decimal outputs of light weights (2), (3), (4), (5), (6) and (7) associated with the positive instructions (+) of each of the channels A, B, C, D, E and F.

It should be mentioned that the pulse which appears at the decimal output (1) at the appearance of each positive burst (+) is not an "output signal" as information and more or less constitutes a "sub-product" of the decoding of the information. This also applies to the two decimal outputs "0" and "8".

It should be mentioned that theoretically the presence of the trigger circuit 27 for resetting the counter 26 to zero is superfluous, because the decimal outputs ($2^0$), ($2^1$) and ($2^2$) of this counter return automatically to zero after the last pulse of each burst; this is true only for the particular case under consideration where bursts comprising eight pulses are counted.

Moreover the presence of the trigger circuit 27 prevents the counting of possible parasitic pulses which may appear between two bursts, which otherwise would disturb decoding in an irreversible manner; with respect to the counting of parasitic pulses which may appear during a burst, the momentary perturbation which they produce is corrected during the bursts which then are automatically resynchronized.

Figure 7:
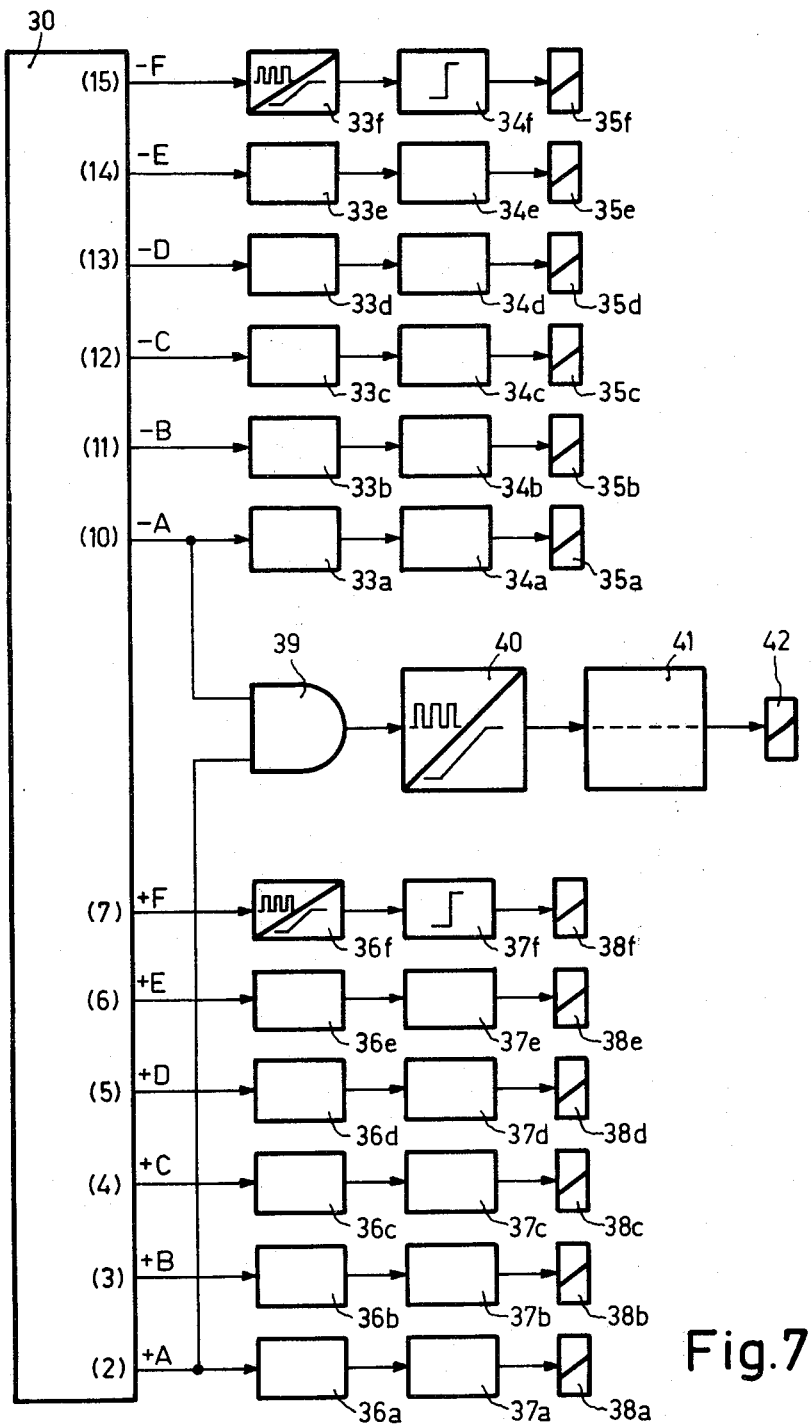
FIG. 7 shows a block-schematic diagram of the "control" section of the receiver part of the device according to the invention.

In FIG. 7, in which corresponding components are designated by the same reference numerals as in FIG. 3, the outputs of the decoder circuit 30 which correspond to the channels (−)A, B, C, D, E and F are connected to six integrating circuits 33a to 33f respectively the outputs of which are connected to six Schmitt triggers 34a to 34f which are coupled to six electromagnetic relays 35a to 35f respectively.

In a similar manner the outputs of the decoder 30 which correspond to the channels (+)A, B, C, D, E and F are connected to six integrating circuits 36a to 36f connected to six Schmitt triggers 37a to 37f connected to six relays 38a to 38f respectively.

The outputs of the decoder circuit 30 which correspond to the channels (−A) and (+)A are connected to two inputs of an AND gate 39 the output of which is connected to the input of an integrating circuit 40. The output of the integrating circuit 40 is connected to the input of a bistable trigger circuit 41 which is coupled to an electromagnetic relay 42.

The arrangement of FIG. 7 operates as follows.

The decoded output pulses from the circuit 30 are integrated by the circuits 33 and 36 so as to produce the direct voltages required for changing the states of the trigger circuits 34 and 37; by way of example the means of influencing each function are shown as electromagnetic relays 35 and 38; obviously these means may be purely electronic, for example by using variable-capacitance diodes.

As has been mentioned hereinbefore, one or several supplementary operations can be remotely controlled by means of the arrangement comprising the AND gate 39, the integrating circuit 40 and the trigger circuit 41.

If, for example, the "on-off" function of an apparatus is to be controlled, it is sufficient to simultaneously depress the keys (+)A and (−)A of the keyboard 1 (FIG. 1).

At this instant the simultaneous presence of pulses at the corresponding outputs of the decoder circuit 30 renders the AND gate 39 conducting, thus enabling, after integration by the circuit 40, a direct voltage for controlling the bistable trigger circuit 41 to be obtained. As soon as the relay 42 is energized, the control keys of the keyboard can be released. A second depression of the keys produces the reverse effect. Obviously the keyboard may comprise a separate "on-off" key which causes the desired contacts to be simultaneously closed or opened.

When the desired supplementary action is not of the "on-off" -type such as the aforementioned one, the bistable trigger circuit 41 need only be replaced by a Schmitt trigger; then the same control conditions apply as for the channels A, B, C, D, E and F, i.e. the keys of the keyboard must be kept depressed until the desired function has been performed.

It will readily be seen that in theory it is possible to perform $6^2$ supplementary functions; however, this finds its limitation in the increasing complexity of the control keyboard and of the decoding circuits.

It will be observed that the supplementary function is heavily protected against being inadvertently triggered, for due to the presence of the AND-gate 39 it is highly improbable that a train of simultaneous parasitic pulses should be applied to the inputs of this gate; this is of particular importance in the example described of "on-off" control of an apparatus.

The normal controls of the channels A, B, C, D, E and F also are quite immune to noise due to the presence of the integrating circuits 34 and 37 which only supply a sufficient control voltage after a certain number of pulses have passed, which prevents any incorrect operation in the occurrency of short parasitic signals.

What is claimed is:

1. A signalling system comprising
   a transmitter, including
   a control keyboard for entering control information, including pairs of keys;
   a clock signal generator;
   a bistable trigger circuit connected to said clock signal generator and having two complementary output leads;
   a first monostable trigger circuit directly connected to said clock signal generator, directly connected to one of said complementary output leads, and having an output;
   N monostable trigger circuits connected in cascade through said first monostable trigger circuit to said clock signal generator, where N is an integer, each of said N circuits including a corresponding terminal, for controlling the duration of the unstable state, connected through a corresponding pair of keys of said control keyboard to said two complementary output leads, each of said N circuits having an output;
   N + 2 differentiating circuits, each of N of said differentiating circuits having an input connected to said respective output of said N trigger circuits; one of said differentiating circuits having an input connected to the output of said first monostable trigger circuit; and one of said differentiating circuits having an input connected to said clock generator; each of said N + 2 differentiating circuits having an output, each of said outputs of said differentiating circuits being interconnected;
   a shaping circuit, having an input connected to said interconnected outputs of said differentiating circuits, and an output; and
   transmitting means connected to said output of said shaping circuit for transmitting a pulse signal.

2. A system as defined in claim 1, further comprising
   a receiver, remote from said transmitter, including
   demodulating means for receiving said pulse signal and producing an output signal;
   a shaping circuit connected to the output of said demodulating means, and having an output;
   a binary counter, having an input connected to the output of said shaping circuit, and an output;
   a resettable bistable trigger circuit, having an input connected to the output of said shaping circuit, and an output;
   a binary/decimal decoder circuit, having an inhibiting terminal input connected to the output of said resettable bistable trigger circuit, and a plurality of decimal outputs, and a plurality of binary inputs, at least some of said binary inputs being connected to the output of said binary counter;
   a monostable trigger circuit, having an input connected to one of said plurality of decimal outputs of said binary/decimal decoder circuit, and an output connected to one of said plurality of binary inputs of said binary/decimal decoder circuit.

3. A system as defined in claim 2, wherein said one of said plurality of binary inputs has a binary value higher than that of said at least some of said binary inputs.

4. A system as defined in claim 2, further comprising a resettable trigger circuit connected between the input terminal of said binary counter and the reset-to-zero terminal of said counter.

5. A system as defined in claim 2, further comprising N integrating circuits connected to said decimal outputs of the binary/decimal decoder circuit corresponding to N transmission channels.

6. A system as defined in claim 5, wherein N integrating circuits are connected to N Schmitt trigger circuits.

7. A system as defined in claim 2, further comprising an AND gate having connected to said outputs of said binary/decimal decoder circuit, corresponding respectively to the opposite directions of change of the same channel.

8. A system as defined in claim 2, further comprising an AND gate having inputs connected to said outputs of the binary/decimal decoder circuit corresponding to two different channels of opposite directions of change.

9. A system as defined in claim 7, wherein said AND gate is followed by a bistable trigger circuit.

10. A system as claimed in claim 7, wherein said AND gate is followed by a Schmitt trigger circuit.

* * * * *